United States Patent
Farnworth et al.

[19]

[11] Patent Number: 6,002,590
[45] Date of Patent: Dec. 14, 1999

[54] FLEXIBLE TRACE SURFACE CIRCUIT BOARD AND METHOD FOR MAKING FLEXIBLE TRACE SURFACE CIRCUIT BOARD

[75] Inventors: Warren M. Farnworth, Nampa; Kevin G. Duesman, Boise, both of Id.

[73] Assignee: Micron Technology, Inc., Boise, Id.

[21] Appl. No.: 09/046,552

[22] Filed: Mar. 24, 1998

[51] Int. Cl.$^6$ .................................................. H05K 7/02
[52] U.S. Cl. .......................... 361/749; 361/750; 361/751; 361/774; 361/776; 257/747; 257/780; 257/737; 257/738; 257/673
[58] Field of Search .................................... 361/749, 750, 361/751, 803, 789, 784, 774, 776; 439/66, 74; 257/747, 780, 737, 738, 673, 669, 668

[56] References Cited

U.S. PATENT DOCUMENTS

| | | | |
|---|---|---|---|
| 4,814,295 | 3/1989 | Mehta | 29/840 |
| 5,081,520 | 1/1992 | Yoshii et al. | 257/702 |
| 5,422,516 | 6/1995 | Hosokawa et al. | 257/775 |
| 5,602,422 | 2/1997 | Schueller et al. | 257/738 |
| 5,790,377 | 8/1998 | Schreiber et al. | 361/704 |
| 5,925,930 | 7/1999 | Farnworth et al. | 257/737 |

FOREIGN PATENT DOCUMENTS

| | | | |
|---|---|---|---|
| 62054340 | 3/1987 | Japan | H01L 21/60 |
| 63316812 | 6/1990 | Japan | H01L 21/60 |

OTHER PUBLICATIONS

Electronic Circuit Cards and Surface Mount Technology, A Guide to their Design, Assembly, and Application; Malcolm R. Haskard; Chapter 2, pp. 16–39 (Printed circuit board technology), 1992.

PC–type substrate handles dissipation; Electronic Design, Mar. 31, 1983; Harold Winard; p. 75E.

Technical articles, Chip–package substrate cushions dense, high–speed circuitries; Electronics/Jul. 14, 1982; pp. 135–141.

*Primary Examiner*—Donald Sparks
*Assistant Examiner*—David Foster
*Attorney, Agent, or Firm*—Dickstein, Shapiro, Morin & Oshinsky LLP

[57] ABSTRACT

A circuit board has traces attached to a flexible trace surface such that the traces can be displaced in a direction of thermal expansion of a component attached to the traces without causing the failure of the solder joint between the component and the trace. In one embodiment, the printed circuit board substrate is etched away in areas not covered by the traces such that flexible protuberances are formed from the substrate underneath the traces. In one method for constructing such a circuit board, a conductive layer is deposited on the printed circuit board substrate. The conductive layer is then etched to form conductive traces. The printed circuit board substrate is then selectively etched using the traces as a mask for etching the printed circuit board substrate. In a second printed circuit board embodiment, a flexible layer of a material is deposited onto the printed circuit board substrate. The traces are then formed on top of the flexible layer. The flexible layer allows the traces to move in the direction of thermal expansion of an attached component without causing failure of the solder joint between the trace and the component.

25 Claims, 9 Drawing Sheets

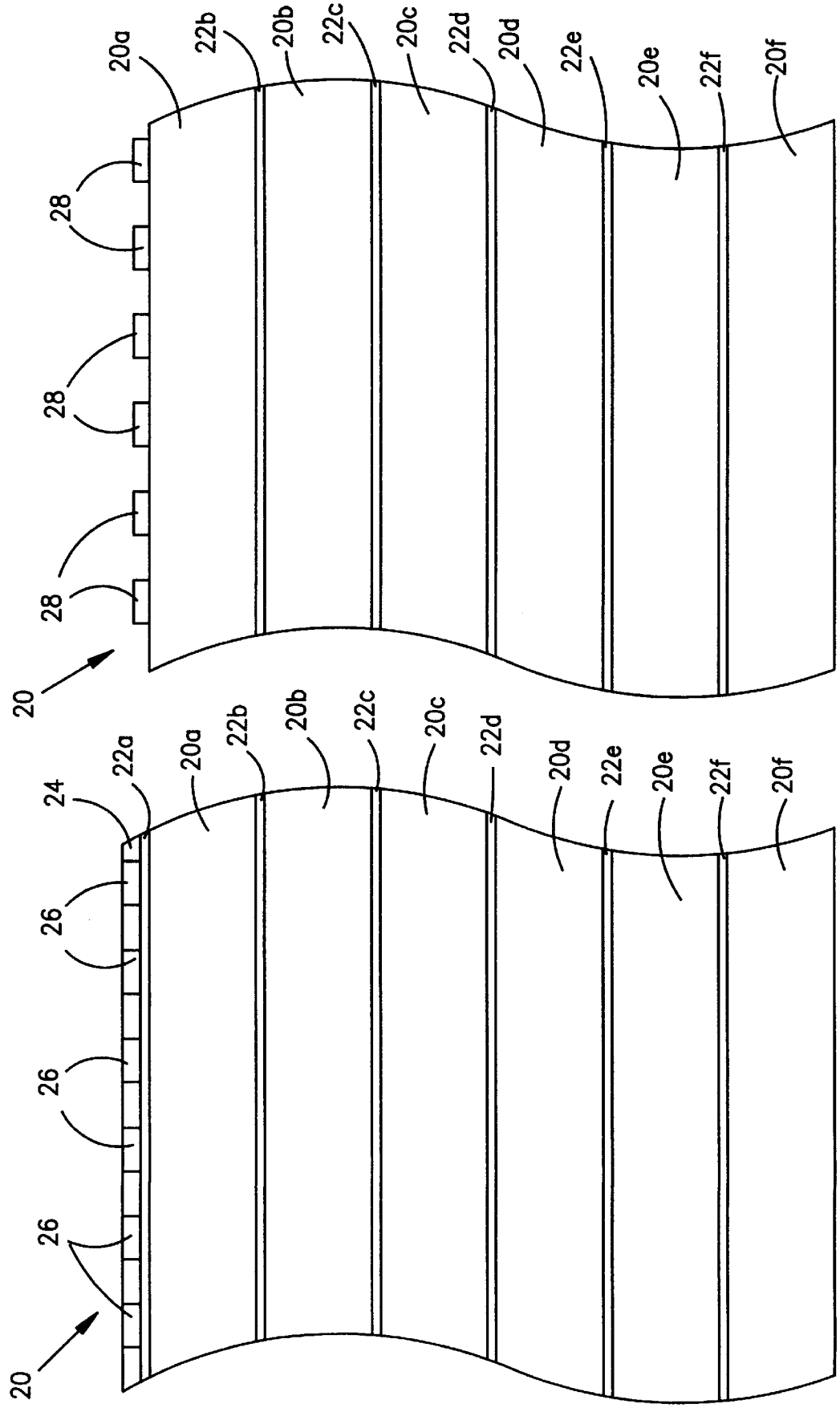

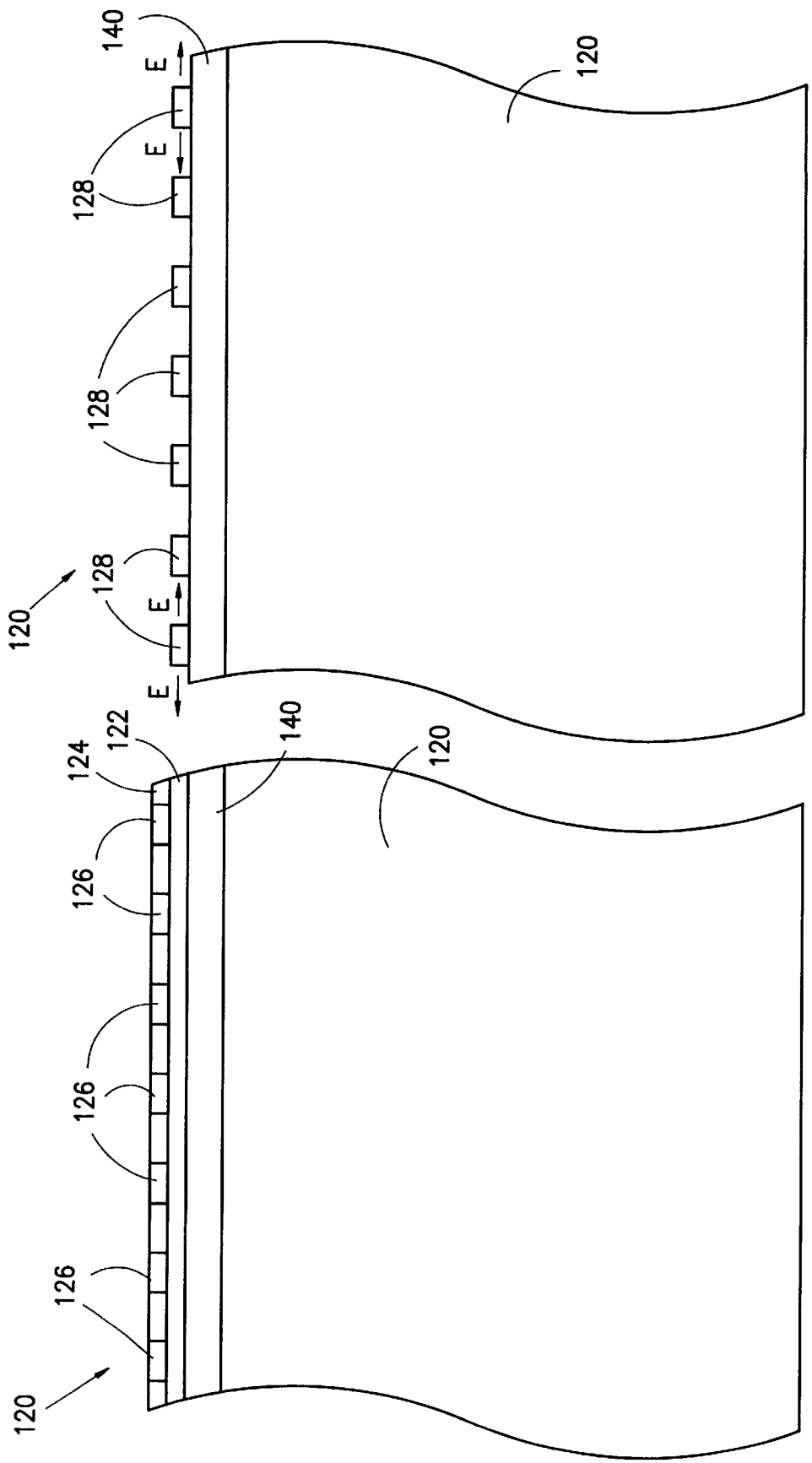

FLEXIBLE TRACE SURFACE CIRCUIT BOARD AND METHOD FOR MAKING FLEXIBLE TRACE SURFACE CIRCUIT BOARD

FIELD OF THE INVENTION

The present invention relates to the field of printed circuit boards and more specifically to a printed circuit board having flexible trace surfaces that allow the traces attached thereto to move in a direction of thermal expansion of components soldered to the traces.

BACKGROUND OF THE INVENTION

Surface mount technology in general and ball grid array technology in particular are becoming increasing popular choices for integrated circuit packaging. Both the size and pin count of surface mount components continue to increase. This trend aggravates the problem of solder joint failure due to coefficient of thermal expansion mismatch between the printed circuit board and components mounted thereon. This problem is particularly acute for ball grid array components. Therefore, although the invention is applicable to any component packaging technology, it will be discussed using a ball grid array component as an example.

A bottom view of a ball grid array (BGA) component 10 is illustrated in FIG. 1. The underside of the BGA component 10 contains a plurality of solder bumps 12. Each solder bump 12 is electrically connected to an internal lead (not shown) which itself is connected to an integrated circuit formed on a silicon wafer (also not shown) inside the BGA component.

FIG. 2 illustrates the connection of a BGA component 10 to a printed circuit board 20. Each solder bump 12 is soldered to a corresponding trace pad 28 on the printed circuit board 20. As can be seen with reference to FIG. 5, the trace pad is an enlarged portion of the trace 27. Referring back to FIG. 2, the trace pads 28 are in positions corresponding to the positions of the solder bumps 12 on the BGA component 10. The other portions of the traces 27 are narrower to allow space for traces 27 between the trace pads 28. The solder bumps 12 may be attached to the corresponding trace pads 28 by well known methods such as reflow soldering or laser soldering.

When power is applied to an integrated circuit, some of that power is converted to heat by the movement of electrons through the integrated circuit. When integrated circuits are heated, they expand. The amount of expansion relative to the heat of a material is expressed as a quantity known as the coefficient of thermal expansion. The higher the coefficient of thermal expansion, the more a material expands when it is heated.

Referring back to FIG. 1, the physical center of the EGA component 10 is indicated by the point labeled NP. The BGA component 10 is perfectly symmetrical, therefore the physical center NP of the BGA is also the thermal neutral point NP. The neutral point NP is the point on the BGA component 10 from which all thermal expansion occurs in a radial direction. Thermal expansion directions are indicated by the vectors "E" extending radially outward from the neutral point NP.

The amount of thermal expansion for each of the solder bumps 12 on the BGA component 10 is dependent upon the distance from the neutral point NP to the solder bump 12. This distance is known as the distance to neutral point, or DNP. As the DNP increases, the amount of movement of a solder bump 12 from the neutral point NP also increases. One reason that components are designed with square packages is to minimize the DNP for all connections.

Referring back to FIG. 2, the vectors "E" indicate the direction of thermal expansion of the BGA component 10 from the neutral point NP. It should be appreciated that as heat is transferred from the BGA component 10 to the printed circuit board 20, the printed circuit board 20 also expands. However, because the printed circuit board 20 and the BGA component 10 are usually made of different materials, the corresponding coefficients of thermal expansion (CTE) may also be different, or mismatched. The result is a net force (which may be positive or negative, depending upon the respective CTEs of the BGA component and the printed circuit board and the amount of heat transferred to the printed circuit board by the BGA component) in the direction of the vector E on the solder bumps 12 and trace pads 28.

When leaded components (e.g. components with 'J' leads or gull wing leads) are used, the leads act as compliant members, allowing for forces on solder joints caused by coefficient of thermal expansion mismatch. However, when leadless components such as BGAs are used, the solder bump 12 is the only available compliant member.

When component sizes and corresponding DNPs are small, the forces on the solder bumps 12 are also small and do not cause a problem. However, when component sizes and corresponding DNPs are large, the forces on the solder bumps 12 are also large and can lead to failure of the solder joint. FIG. 3 is an enlarged view of a single solder bump 12 that has failed. The force on the solder bump 12 in the direction of the vector "E" caused by the CTE mismatch between the BGA component 10 and the printed circuit board 20 has caused cracks 14, 16 in the solder bump 12. A crack 14 has completely broken the connection between the solder bump 12 and the BGA component 10, resulting in an open circuit. A second crack 16 near the bottom of the solder bump 12 has also begun.

FIG. 4 illustrates one attempted solution to this problem. The spaces underneath the BGA component 10 between the solder bumps 12 and printed circuit board 20 are filled with an underfill material 18. The underfill 18 acts as an adhesive between the BGA component 10 and the printed circuit board 20 such that movement between them is prevented.

There are two main disadvantages to this solution. First, the adhesive eventually fails, leading to solder joint failure after repeated thermal cycling. Second, the underfill must be "wicked" under the BGA component 10 between the solder bumps 12, which is a time-consuming, and therefore expensive, procedure.

A second solution to the problem is to minimize the CTE mismatch between the BGA component 10 and the printed circuit board 12. The disadvantage to this solution is that the materials needed to achieve a good CTE match result in increased production costs.

What is needed is an inexpensive and reliable apparatus and method for attaching components and printed circuit boards with mismatched coefficients of thermal expansion.

SUMMARY OF THE INVENTION

The present invention solves the problem identified above by providing a circuit board with traces attached to a flexible trace surface such that the traces can be displaced in a direction of thermal expansion of a component attached to the traces without causing the failure of the solder joint between the component and the trace. In one embodiment, the printed circuit board substrate is etched away in areas not covered by the traces such that flexible protuberances are formed from the substrate underneath the traces. Methods for forming such a printed circuit board are also disclosed. In one method, a conductive layer is deposited on the printed circuit board substrate. The conductive layer is then etched to form conductive traces. The printed circuit board substrate is then selectively etched using the traces as a mask to form mesas which support the conductive traces.

In a second printed circuit board embodiment, a flexible layer of a silicone based material is deposited onto the printed circuit board substrate. As used herein, silicone based material means a material comprising at least approximately 50% silicone. The traces are then formed on top of the flexible silicone layer. The flexible silicone layer allows the traces to move in the direction of thermal expansion of an attached component without causing failure of the solder joint between the trace and the component.

It is known in the art to manufacture printed circuit boards with elastomeric layers between the traces and the underlying substrate. For example, Exacta Circuits Ltd. produces a product known as "Chipstrate" that has such an elastomeric layer. Known elastomeric layers are composed of standard materials commonly used in printed circuit board fabrication such as polyimides, epoxies, modified epoxies, nitrile rubber blends with phenolics, and acrylics. However, silicone based materials offer significant manufacturing advantages over these standard materials. For example, silicone does not have to be thermally cycled or mixed (in the case of two part epoxies) like these standard materials. Silicone based materials are also capable of being applied in much thinner layers (on the order of 1–2 mils) than these standard materials and can be applied in dry form as a laminate as well as in wet form.

The present invention has several advantageous features. First, circuit boards according to the present invention do not impose additional constraints upon circuit board layout. Second, circuit boards according to the present invention do not require any exotic materials or construction techniques. Third, the reliability of the solder joint is increased as compared with other techniques.

The above and other advantages and features of the invention will be more readily understood from the following detailed description of the invention which is provided in connection with the accompanying drawings.

BRIEF DESCRIPTION OF THE DRAWINGS

FIG. 6 is a cross sectional view, taken along the line VI—VI of FIG. 5, of a portion of a multilayer printed circuit board according to one embodiment of the present invention to which an upper conductive layer and a photoresist layer have been added;

FIG. 7 is a cross sectional view of the multilayer printed circuit board of FIG. 6 after the conductive layer has been etched;

FIG. 10 is a cross sectional view of a portion of a single layer printed circuit board according to a second embodiment of the present invention to which a flexible silicone layer, a conductive layer and a photoresist layer have been added.

FIG. 11 is a cross sectional view of the printed circuit board of FIG. 9 after the conductive layer has been etched;

DETAILED DESCRIPTION OF THE EMBODIMENTS

The invention will be described and illustrated below with particular reference to its use with ball grid array components. However, the invention is not limited to use with BGA components and may be used with any component for which decreased strain on solder joints is desirable. Similarly, the invention will be described using particular materials for printed circuit board substrates, trace materials, etchants, etc. However, the invention is not limited to any particular material but rather may be practiced using a wide variety of materials.

Figure 1:
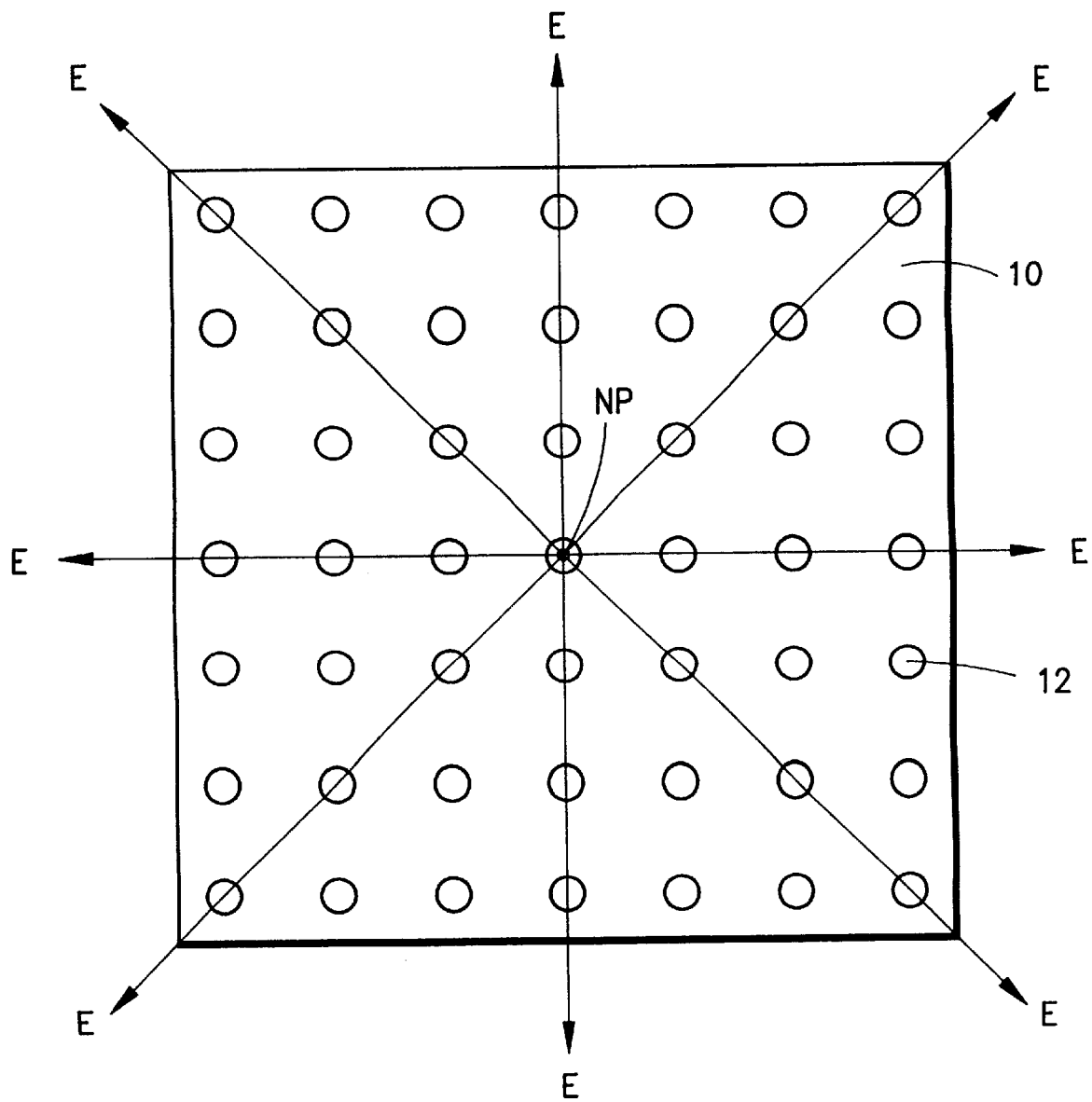
FIG. 1 is a bottom view of a ball grid array component.
Figure 2:
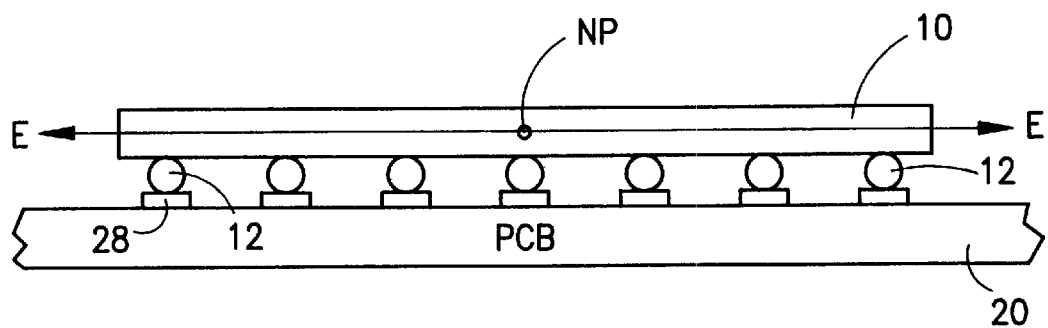
FIG. 2 is a side view of the ball grid array component of FIG. 1 attached to a conventional printed circuit board.
Figure 3:
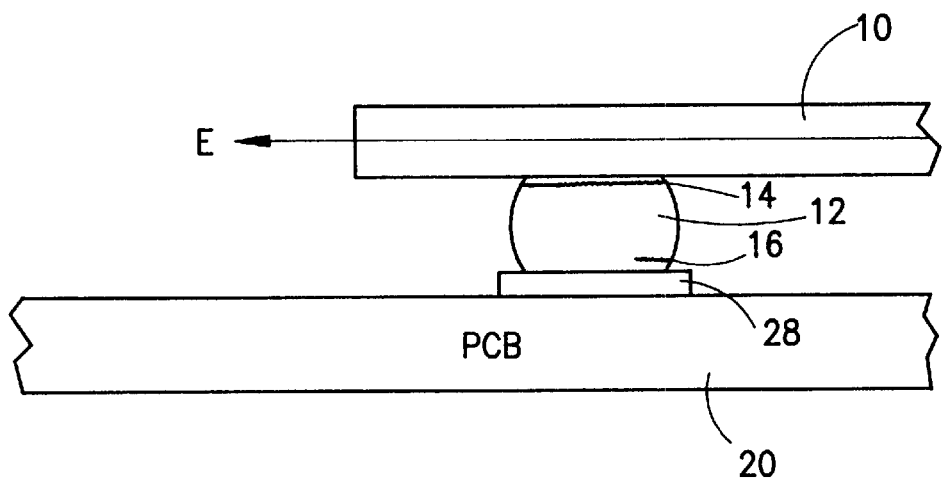
FIG. 3 is a side view of a failed solder joint between a component and a printed circuit board.
Figure 4:
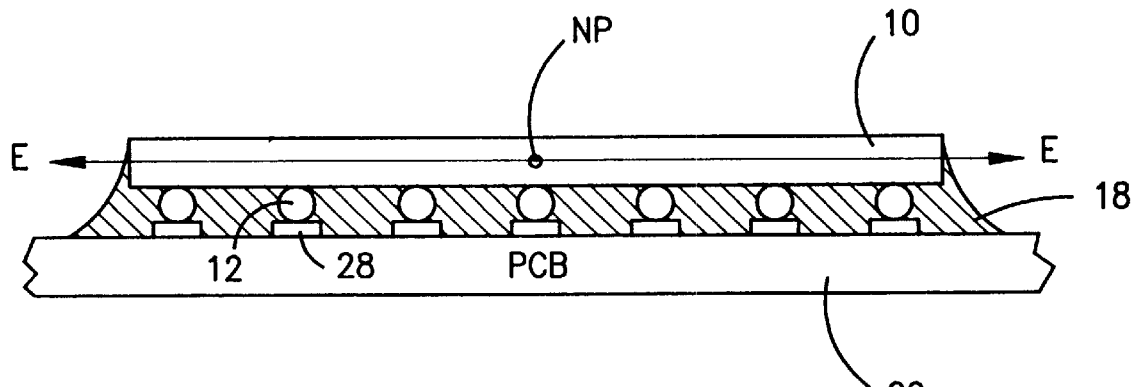
FIG. 4 is side view of a ball grid array component attached to a printed circuit board with underfill.
Figure 5:
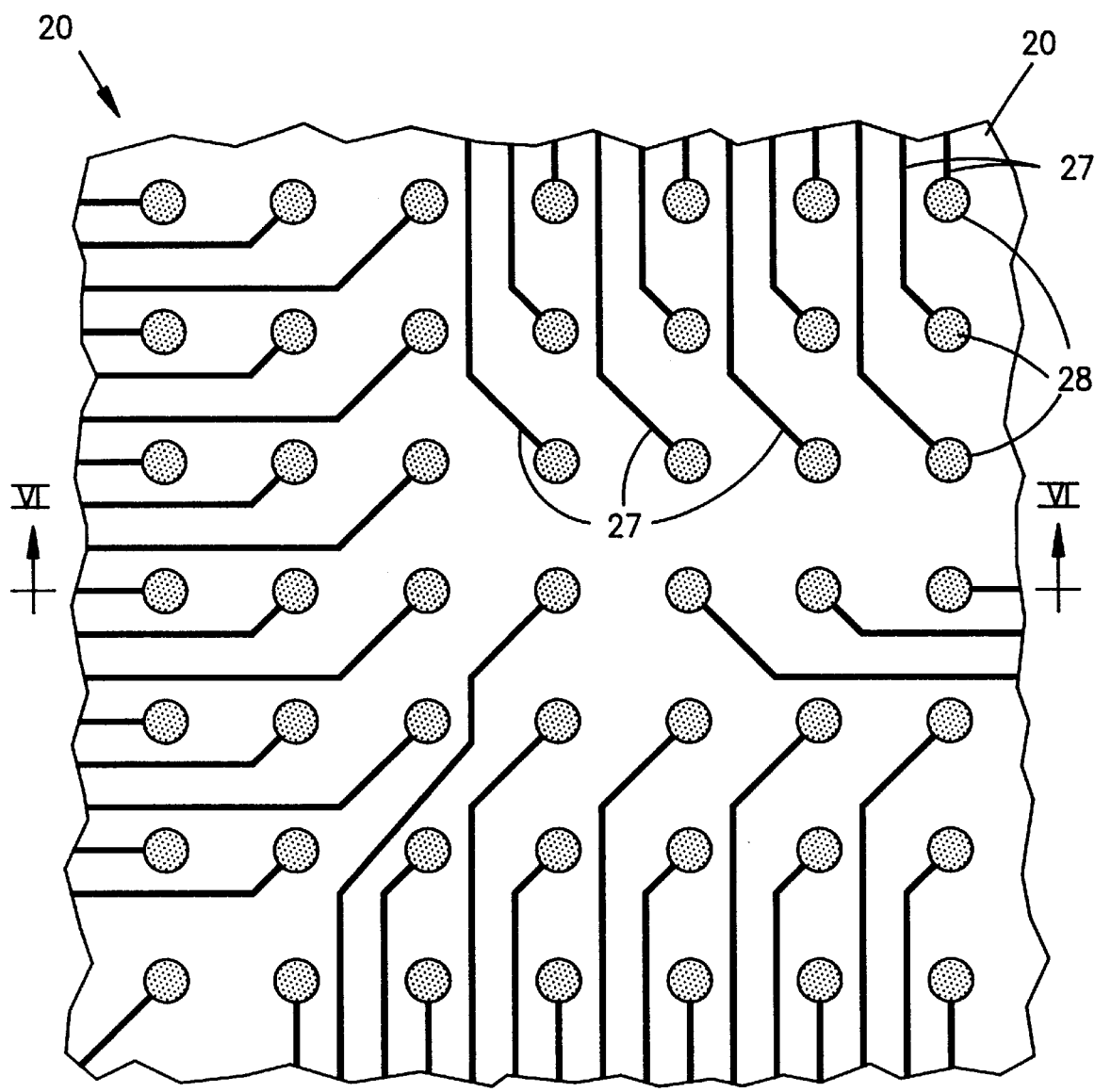
FIG. 5 is a top view of a portion of a printed circuit board showing traces and trace pads for receiving a ball grid array component.

FIG. 5 illustrates a top view of a portion of a multilayer circuit board 20 according to the present invention. Traces 27 and trace pads 28 (which are simply enlarged trace areas in the positions corresponding to solder bumps of a ball grid array component) composed of a conductive material such as copper are attached to the upper substrate layer 20a.

FIG. 6 illustrates a side view of the multilayer circuit board 20 of FIG. 5. The multilayer circuit board 20 has six substrate layers 20a–20f and six conductive layers 22a–22f. It should be understood, however, that the number of substrate and conductive layers is a matter of choice and is merely illustrative of the invention. There may be more or less layers.

Each of the substrate layers 20a–20f is approximately 8 mils thick and each conductive layer 22a–22f is approximately a half mil thick, where 1 mil is one one-thousandth of an inch. The substrate layers 20a–20f are laminated and are composed of polyimide resin and fiberglass. The layers are attached to each other using a conventional adhesive.

Except for the top conductive layer 20a, each of the conductive layers 20b–20f has been etched to provide traces. The upper conductive layer 20a has been covered with a photoresist layer 24 defining a number of trace areas (not shown) and trace pad areas 26. FIG. 7 shows the multilayer circuit board 20 of FIG. 6 after the conductive layer 20a has been etched using a metal etchant to form the traces 27 (not shown in FIG. 7) and trace pads 28.

Figure 8:
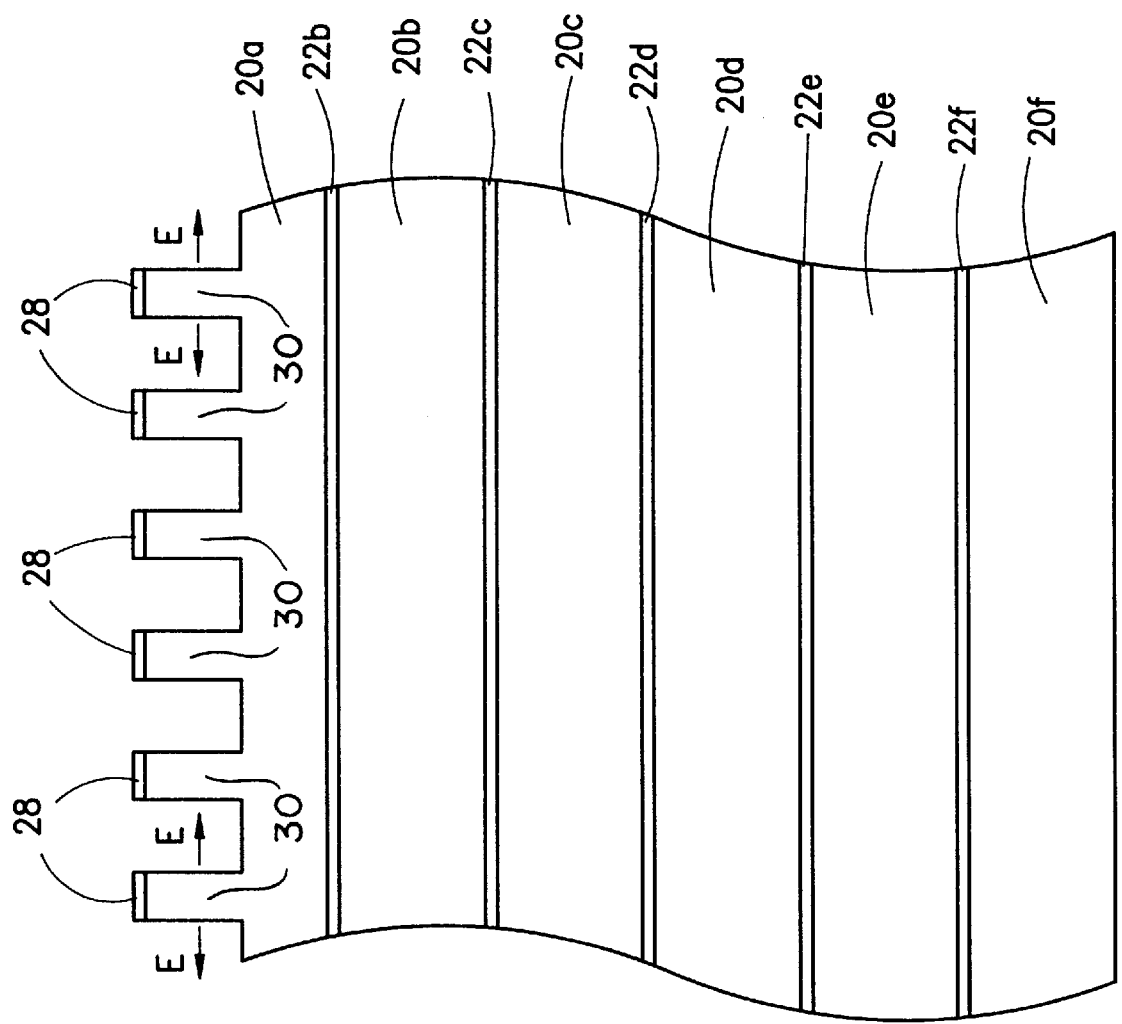
FIG. 8 is a cross sectional view of the multilayer printed circuit board of FIG. 7 after the substrate has been etched.

Next, the upper substrate layer 20a is etched with the proper etchant using hydrazine. The previously defined traces and trace pads 28 may be used as a mask for the polymer etchant such that only the areas of the substrate 20a not covered by traces or trace pads 28 are etched. The resultant circuit board is shown in FIG. 8. The unetched areas of the upper substrate layer 20a form a plurality of flexible protuberances 30 under the trace pads 28. The trace pads 28 are attached to the top surfaces of the protuberances 30. The top surfaces of the protuberances 30 together form a flexible trace surface.

The flexible protuberances 30 are flexible in the direction of thermal expansion of an attached component as indicated by the vectors labeled "E" in FIG. 8. The direction of thermal expansion is generally parallel to the substrate layer 20a.

Figure 9:
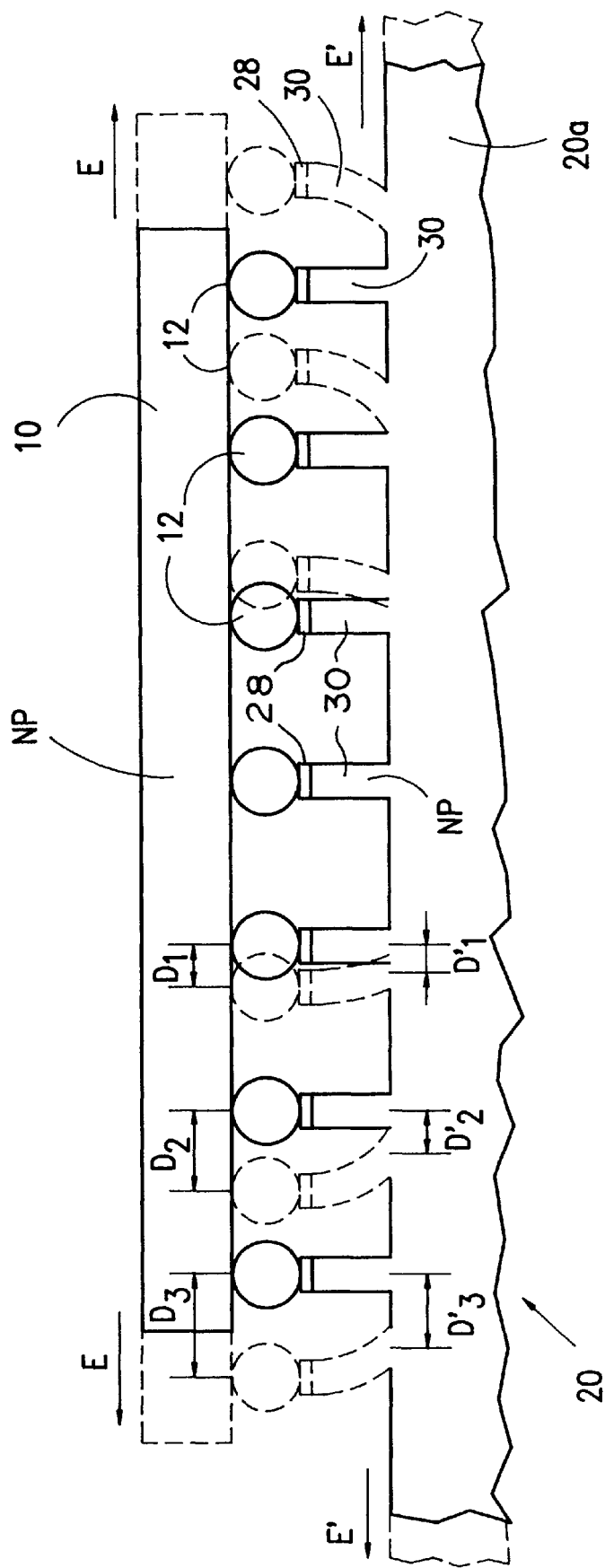
FIG. 9 is a side view of an upper layer of the circuit board of FIG. 8 with a ball grid array component mounted thereon.

FIG. 9 is an enlarged view of the upper layer 20a of the circuit board 20 of FIG. 8 with a ball grid array component 10 mounted thereon. The dashed lines in FIG. 9 show the component 10 and the circuit board 20a after they have thermally expanded. The component 10 and the circuit board 20 have expanded by different amounts as indicated by the vectors "E" and "E'" in FIG. 9. This difference in expansion is caused by coefficient of thermal expansion mismatch between the component 10 and the circuit board 20. The distance by which the solder bumps 12 and the protuberances 30 have been displaced is dependent upon their distance $D_1$, $D_2$, D3, $D_1'$, $D_2'$, $D_3'$ from the neutral point NP. Because of the differences in displacement, the protuberances 30 at the edges of the component 10 are required to flex the greatest amount.

Approximately 50% of the thickness of the upper substrate layer 20a has been removed in FIG. 8. However, the amount of substrate removed can range anywhere from approximately 5% to approximately 80% of the total thickness of the upper (or bottom) substrate layer. The actual amount of material removed is more limited for single layer circuit boards as compared with multilayer boards for the simple reason that multilayer boards have additional layers to provide support. The actual amount of material removed is also dependent upon how much flexibility is required, which in turn is dependent upon the strain put on the solder joint by thermal expansion, which in turn is dependent upon the component/circuit board coefficient of thermal expansion mismatch, the amount of heat generated by the component, thermal management (the use of heat sinks, ventilation, etc.), and the thickness of the traces and trace pads 28. The coefficient of thermal expansion mismatch depends upon the materials used in the component and the circuit board. The determination of all of these factors is well known and need not be discussed here.

Although only the upper substrate layer 20a has been etched to form a flexible trace surface, it will be apparent to those skilled in the art that another conductive layer may be deposited on the underside of the bottom substrate 20f and the above process repeated to define a second flexible trace surface thereon. Similarly, although the above process was performed by etching the conductive layer 22a and the substrate layer 20a separately, it may possible to etch both layers at the same time, provided that materials capable of being etched by a common etchant are selected for the conductive and substrate layers. Finally, processes other than etching, including mechanical processes such as cutting, abrasion or routing, may also be used to remove the desired portions of the conductive and substrate layers 22a, 20a.

A second embodiment of a circuit board 120 according to the present invention is shown in FIG. 10. The circuit board 120 comprises a single substrate layer 120 composed of commonly used FR4 (reinforced fiberglass, fire resistance level 4). A flexible silicone layer 140 has been deposited at a thickness of approximately 2 mils. A conductive layer 122 of copper has been deposited on top of the flexible layer 140 at a thickness of approximately 1 mil, and a photoresist layer 124 has been deposited on top of the conductive layer 122. As in the first embodiment, the photoresist layer 124 defines a number of trace pad areas 126 corresponding to solder bumps of a ball grid array component (not shown in FIG. 10) to be attached to the circuit board during assembly.

FIG. 11 shows the circuit board 120 after the conductive layer has been etched, possibly using potassium hydroxide, to form traces and trace pads 128. The traces and trace pads 128 are attached to the flexible silicone layer 140. The flexible layer 140 acts as a flexible trace surface allowing the traces and trace pads 128 to move in the direction of thermal expansion of an attached component as indicated by the vectors labeled "E" in FIG. 10.

Figure 12:
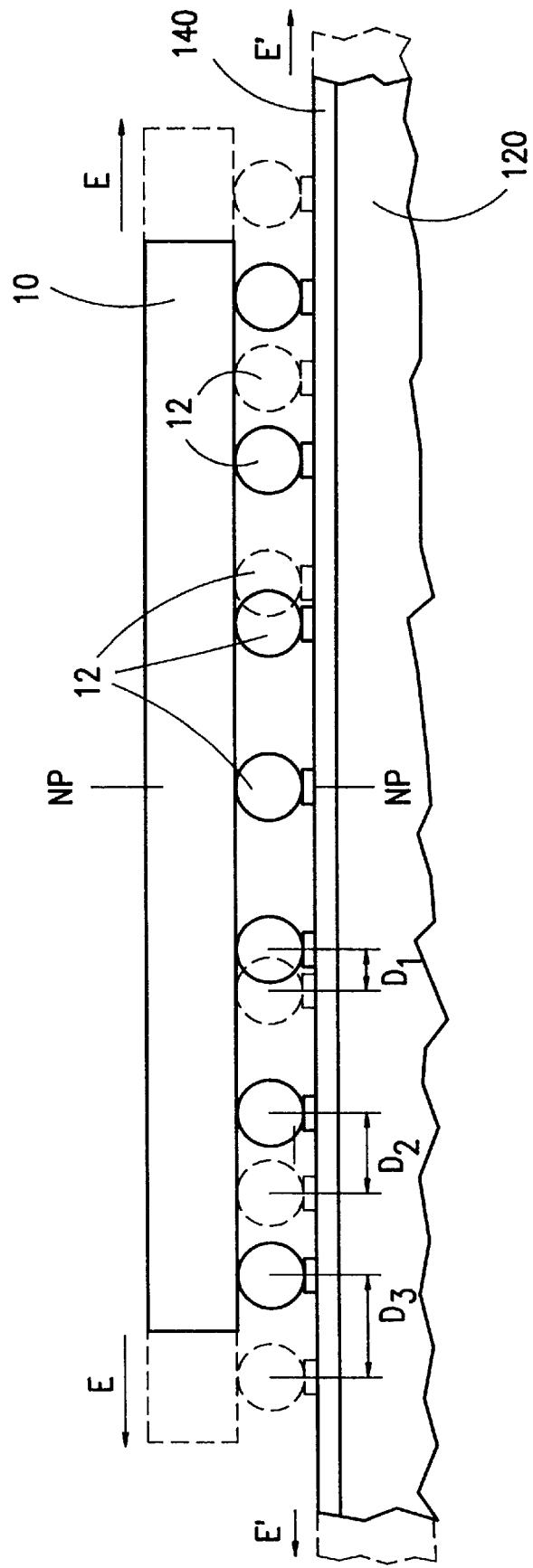
FIG. 12 is a side view of the printed circuit board of FIG. 11 with a ball grid array component mounted thereon.

FIG. 12 is an enlarged view of the upper portion of the circuit board 120 of FIG. 11 with a ball grid array component 10 mounted thereon. The dashed lines in FIG. 12 show the component 10 and the circuit board 120 after they have thermally expanded. The component 10 and the circuit board 120 have expanded by different amounts as indicated by the vectors "E" and "E'" in FIG. 12. This difference in expansion is caused by coefficient of thermal expansion mismatch between the component 10 and the circuit board 120. The differences in the coefficient of thermal expansion result in displacement of the solder bumps 12 by varying distances $D_1$, $D_2$, $D_3$. The displacement of the solder bumps 12 is allowed for by the flexible silicone layer 140, which expands by varying distances $D_1$, $D_2$, $D_3$ such that the solder bumps 12 remain attached to the trace pads 128.

As with the first embodiment, many different materials and techniques may be used for manufacturing the circuit board 120. For example, portions of the flexible layer 140 could be removed along with corresponding portions of the conductive layer 120 to form a flexible trace surface having protuberances similar to the protuberances formed from the substrate in the first embodiment. Other differences, such as the number of layers, the substrate and conductive layer materials, techniques for forming the traces, etc., as discussed above in connection with the first embodiment, are also possible.

Figure 13A:
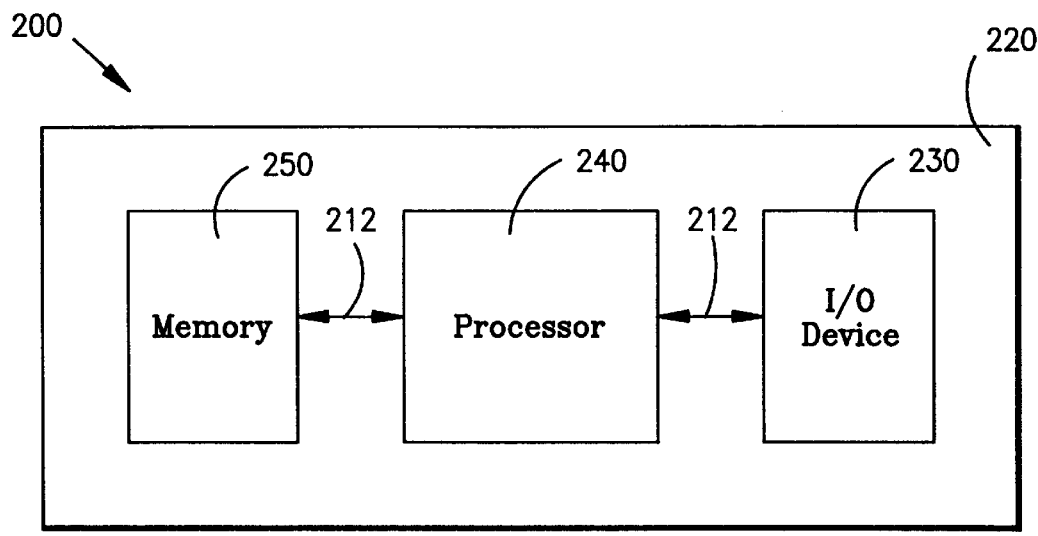
FIGS. 13a and 13b is a block diagram of a computer system according to the present invention.
Figure 13B:
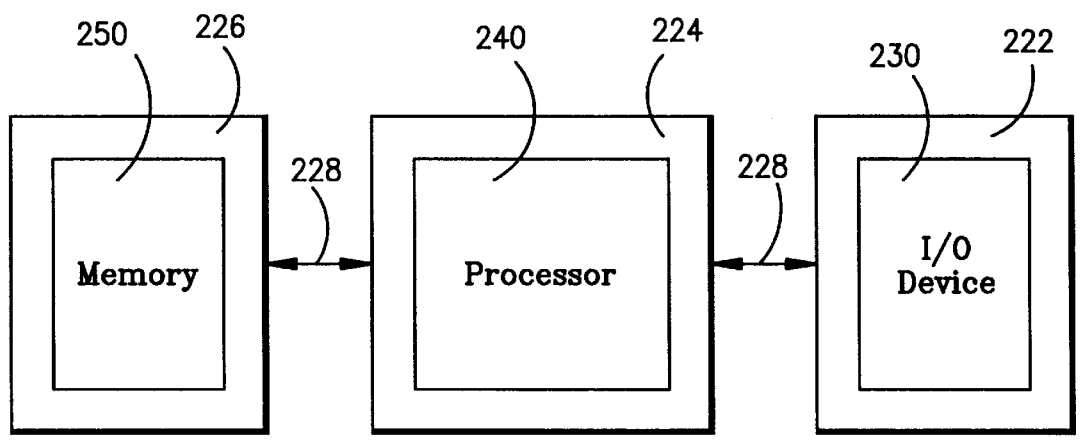

FIGS. 13a and 13b are block diagrams illustrating computer systems employing circuit boards 220 with flexible trace surfaces. The computer system is comprised of a processor 240 connected to a memory 250 and an I/O device 230. FIG. 13a shows the processor 240, the memory 250 and the I/O device 230 mounted on a single circuit board 220. The components are connected by traces 212. This configuration is known as a single board computer.

FIG. 13b shows the processor 240, the memory 250 and the I/O device 230 mounted on separate circuit boards 224, 226, 222. The circuit board 224 on which the processor 240 is mounted is electrically connected to the other circuit boards 222, 226 by buses 228. This arrangement is often seen, for example, in personal computers, wherein the central processor is mounted on a motherboard, some memory components are mounted on SIMMs (single in-line memory modules), and I/O devices such as video cards, modems, etc. are mounted on expansion cards.

The above description and accompanying drawings are only illustrative of preferred embodiments which can achieve and provide the objects, features and advantages of the present invention. It is not intended that the invention be limited to the embodiments shown and described herein. The invention is only limited by the spirit and scope of the following claims.

What is claimed as new and desired to be protected by Letters Patent of the United States is:

1. A circuit board comprising:
   at least one substrate having a flexible trace surface comprising a plurality of flexible protuberances formed from said substrate, each of the protuberances having a top surface; and a plurality of conductive traces attached to said top surfaces of said flexible protuberances such that said traces can be displaced in at least one direction in a plane generally parallel to said substrate.

2. The circuit board of claim 1, wherein the at least one substrate consists of a single substrate.

3. The circuit board of claim 2, wherein the substrate has a single flexible trace surface.

4. The circuit board of claim 2, wherein the substrate has two flexible trace surfaces.

5. The circuit board of claim 1, wherein the at least one substrate comprises a plurality of substrates, including a top substrate and a bottom substrate.

6. The circuit board of claim 5, wherein both the top and bottom substrates have a flexible trace surface.

7. A circuit board assembly comprising:
at least one substrate having a flexible trace surface comprising a plurality of flexible protuberances formed from said substrate, each of the protuberances having a top surface;
a plurality of conductive traces attached to said top surfaces of said flexible protuberances such that said traces can be displaced in at least one direction in a plane generally parallel to said substrate; and
at least one component attached to at least one of said conductive traces.

8. The circuit board assembly of claim 7, wherein the at least one substrate consists of a single substrate.

9. The circuit board assembly of claim 8, wherein the substrate has a single flexible trace surface.

10. The circuit board assembly of claim 8, wherein the substrate has two flexible trace surfaces.

11. The circuit board assembly of claim 7, wherein the at least one substrate comprises a plurality of substrates, including a top substrate and a bottom substrate.

12. The circuit board assembly of claim 11, wherein both the top and bottom substrates have a flexible trace surface.

13. The circuit board assembly of claim 7, wherein the component is enclosed in a surface mount package.

14. The circuit board assembly of claim 13, wherein the surface mount package is a ball grid array package.

15. A computer system comprising:
a processor,
a memory,
an input/output device, and
at least one circuit board comprising:
at least one substrate having a flexible trace surface comprising a plurality of flexible protuberances formed from said substrate, each of the protuberances having a top surface; and
a plurality of conductive traces attached to said top surfaces of said flexible protuberances such that said traces can be displaced in at least one direction in a plane generally parallel to said substrate;
said processor, said memory, and said input/output device being attached to at least one of said conductive traces on at least one circuit board such that said processor is in electrical contact with said memory and said input/output device.

16. The computer system of claim 15, wherein the at least one substrate consists of a single substrate.

17. The computer system of claim 16, wherein the substrate has a single flexible trace surface.

18. The computer system of claim 16, wherein the substrate has two flexible trace surfaces.

19. The computer system of claim 15, wherein the at least one substrate comprises a plurality of substrates, including a top substrate and a bottom substrate.

20. The computer system of claim 19, wherein both the top and bottom substrates have a flexible trace surface.

21. The computer system of claim 15, wherein the component is enclosed in a surface mount package.

22. The computer system of claim 21, wherein the surface mount package is a ball grid array package.

23. A circuit board comprising:
at least one substrate;
a flexible trace surface comprising a flexible layer attached to said substrate, the flexible layer comprising at least approximately 50% silicone; and
a plurality of conductive traces attached to said flexible layer such that said traces can be displaced in at least one direction in a plane generally parallel to said substrate.

24. A circuit board assembly comprising:
at least one substrate;
a flexible trace surface comprising a flexible layer attached to said substrate, the flexible layer comprising at least approximately 50% silicone;
a plurality of conductive traces attached to said flexible layer such that said traces can be displaced in at least one direction in a plane generally parallel to said substrate; and
at least one component attached to at least one of said conductive traces.

25. A computer system comprising:
a processor,
a memory,
an input/output device, and
at least one circuit board comprising:
at least one substrate;
a flexible trace surface comprising a flexible layer attached to said substrate, the flexible layer comprising at least approximately 50% silicone; and
a plurality of conductive traces attached to said flexible layer such that said traces can be displaced in at least one direction in a plane generally parallel to said substrate;
said processor, said memory, and said input/output device being attached to at least one of said conductive traces on at least one circuit board such that said processor is in electrical contact with said memory and said input/output device.

* * * * *

UNITED STATES PATENT AND TRADEMARK OFFICE
CERTIFICATE OF CORRECTION

PATENT NO. : 6,002,590
DATED : December 14, 1999
INVENTOR(S) : Warren Farnworth et al.

It is certified that error appears in the above-identified patent and that said Letters Patent is hereby corrected as shown below:

Column 1, Line 16, delete "increasing" and insert

-- increasingly --.

Column 5, Line 17, delete "D3" and insert

-- $D_3$ --.

Signed and Sealed this

Eleventh Day of July, 2000

Attest:

Q. TODD DICKINSON

*Attesting Officer*  *Director of Patents and Trademarks*